United States Patent
Kim et al.

(10) Patent No.: US 10,856,420 B2
(45) Date of Patent: Dec. 1, 2020

(54) FLEXIBLE SUBSTRATE AND FLEXIBLE DISPLAY DEVICE INCLUDING THE SAME

(71) Applicant: Samsung Display Co., Ltd., Yongin-si (KR)

(72) Inventors: Byungsun Kim, Yongin-si (KR); Wonkyu Kwak, Yongin-si (KR); Kwangmin Kim, Yongin-si (KR); Hyejin Shin, Yongin-si (KR); Taekyoung Hwang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 530 days.

(21) Appl. No.: 15/213,231

(22) Filed: Jul. 18, 2016

(65) Prior Publication Data
US 2017/0188463 A1    Jun. 29, 2017

(30) Foreign Application Priority Data
Dec. 28, 2015  (KR) .......................... 10-2015-0187637

(51) Int. Cl.
| | |
|---|---|
| *H05K 1/18* | (2006.01) |
| *H01L 27/32* | (2006.01) |
| *H01L 51/00* | (2006.01) |
| *H05K 1/02* | (2006.01) |
| *H05K 1/11* | (2006.01) |

(52) U.S. Cl.
CPC ........... *H05K 1/18* (2013.01); *H01L 27/3262* (2013.01); *H01L 27/3276* (2013.01); *H01L 51/0097* (2013.01); *H05K 1/028* (2013.01); *H05K 1/115* (2013.01); *H01L 2251/5338* (2013.01); *Y02E 10/549* (2013.01)

(58) Field of Classification Search
CPC .......... H05K 1/18; H05K 1/115; H05K 1/028; H01L 51/0097; H01L 27/3262; H01L 27/3276
See application file for complete search history.

(56) References Cited

U.S. PATENT DOCUMENTS

| | | | |
|---|---|---|---|
| 5,348,792 A | * | 9/1994 | Hattori ................ H01L 21/4857 |
| | | | 257/E23.173 |
| 6,184,478 B1 | * | 2/2001 | Imano .................. H05K 1/0253 |
| | | | 174/255 |

(Continued)

FOREIGN PATENT DOCUMENTS

| | | |
|---|---|---|
| JP | 2009-259882 A | 11/2009 |
| KR | 10-2014-0099139 A | 8/2014 |

(Continued)

*Primary Examiner* — Nathan Milakovich
(74) *Attorney, Agent, or Firm* — F. Chau & Associates, LLC

(57) ABSTRACT

A flexible substrate and a flexible display device including the same are disclosed. In one aspect, the flexible substrate includes a first substrate that is flexible and a metal wiring layer over the first substrate and having a first surface facing the first substrate, a second surface opposite to the first surface, and a plurality of holes penetrating the first and second surfaces. The holes are arranged in a plurality of rows. The holes comprise a first hole in an n-th row and a first hole in a (n−1)th row. The first hole of the n-th row is spaced apart from the first hole in the (n−1)th row by a first distance, and an edge of each of the holes is curved.

13 Claims, 5 Drawing Sheets

(56) References Cited

U.S. PATENT DOCUMENTS

| | | | | |
|---|---|---|---|---|
| 7,378,599 B2* | 5/2008 | Somei | | H01Q 1/247 |
| | | | | 174/255 |
| 7,663,063 B2* | 2/2010 | Lin | | H05K 1/0253 |
| | | | | 174/255 |
| 8,003,900 B2* | 8/2011 | Watazu | | B32B 15/02 |
| | | | | 156/150 |
| 8,256,111 B2* | 9/2012 | Lin | | H01L 23/49838 |
| | | | | 174/254 |
| 10,056,446 B2* | 8/2018 | Kim | | G09G 3/3291 |
| 10,192,949 B2* | 1/2019 | Choi | | H01L 27/3276 |
| 10,211,276 B2* | 2/2019 | Choi | | H01L 27/3244 |
| 10,636,861 B2* | 4/2020 | Kim | | H01L 51/0097 |
| 10,672,755 B2* | 6/2020 | Wu | | G02F 1/133305 |
| 2008/0144295 A1* | 6/2008 | Wang | | H05K 1/0224 |
| | | | | 361/750 |
| 2010/0132981 A1* | 6/2010 | Muro | | H05K 1/0236 |
| | | | | 174/250 |
| 2010/0143848 A1* | 6/2010 | Jain | | B81C 1/0019 |
| | | | | 430/315 |
| 2014/0217397 A1 | 8/2014 | Kwak et al. | | |
| 2015/0060778 A1 | 3/2015 | Kim et al. | | |
| 2015/0091005 A1 | 4/2015 | Park | | |
| 2015/0380355 A1* | 12/2015 | Rogers | | H01L 23/538 |
| | | | | 257/773 |
| 2016/0105950 A1* | 4/2016 | Drzaic | | B05D 3/002 |
| | | | | 174/251 |
| 2018/0212051 A1* | 7/2018 | Wu | | H01L 51/0097 |
| 2018/0301520 A1* | 10/2018 | Jin | | H01L 27/3223 |
| 2018/0315809 A1* | 11/2018 | Kim | | H01L 27/3276 |
| 2019/0013379 A1* | 1/2019 | Kim | | G09G 3/3291 |
| 2020/0161412 A1* | 5/2020 | Lin | | G09F 9/3026 |

FOREIGN PATENT DOCUMENTS

| | | |
|---|---|---|
| KR | 10-2015-0026709 A | 3/2015 |
| KR | 10-2015-0037159 A | 4/2015 |

* cited by examiner

FLEXIBLE SUBSTRATE AND FLEXIBLE DISPLAY DEVICE INCLUDING THE SAME

CROSS-REFERENCE TO RELATED APPLICATION

This application claims the benefit of Korean Patent Application No. 10-2015-0187637, filed on Dec. 28, 2015, in the Korean Intellectual Property Office, the disclosure of which is incorporated herein in its entirety by reference.

BACKGROUND

Field

The described technology generally relates to a flexible substrate and a flexible display device comprising the flexible substrate.

Description of the Related Technology

As information technology has developed, market demand for display devices that can connect users and information has grown. Exemplary types of display technologies include liquid crystal displays (LCDs), organic light-emitting diode (OLED) displays, electrophoretic displays (EPDs), and plasma display panels (PDPs).

Recently, research and development has been actively conducted on flexible display panels that can be bent or unfolded in various directions. These displays are generally manufactured using thin film technologies to deposit multiple layers of active and passive materials on a flexible substrate such as plastic.

However, since metal wiring included in the flexible display panel has a lower flexibility than other layers, when the flexible display panel is bent or folded, the metal wiring is vulnerable to stress. Concentrated stress on the metal wiring can result in short-circuits or cracks, and thus, reliability of a flexible display panel may degrade.

SUMMARY OF CERTAIN INVENTIVE ASPECTS

One inventive aspect relates to a flexible substrate including a metal wiring having an improved flexibility by distributing stress, and a flexible display device including the flexible substrate.

Another aspect is a flexible substrate that includes a first substrate that is flexible, and a metal wiring layer on the first substrate and having a first surface facing the first substrate, a second surface opposite to the first surface, and a plurality of holes penetrating from the first surface to the second surface, in which the plurality of holes are arranged in a plurality of rows, a hole in an n-th row is spaced apart from a hole in a (n−1)th row by a first distance in a row direction, and a plane of each of the plurality of holes is shaped in a curve.

The first distance may be smaller than a width of the hole in the (n−1)th row.

The first substrate may include a deformed area that is bent or folded, and the plurality of holes may be arranged in the metal wiring layer at a position corresponding to the deformed area.

Planes of the plurality of holes may have a same shape.

An outline of each of the plurality of holes may include a first curved portion and a second curved portion connected to the first curved portion.

Each of the first curved portion and the second curved portion may include a clockwise rounded section and a counterclockwise rounded section, with respect to a start point at a reference point on a first axis along a column direction.

The first curved portion may include a first section clockwise rounded with a first curvature from the first axis along the column direction, a second section connected to the first section and counterclockwise rounded with a second curvature from the first section, and a third section clockwise connection to the second section and clockwise rounded with a third curvature from the second section.

The second curved portion may be symmetrical to the first curved portion with respect to the first axis along the column direction perpendicular to the row direction.

The first curvature may be the same as the third curvature.

The first curved portion may be symmetrical with respect to a second axis along in the row direction and passing through the first curved portion.

The flexible substrate may further include an insulating layer provided on the metal wiring layer.

Another aspect is a flexible display device that includes a first substrate that is flexible, a plurality of pixels arranged on the first substrate, and a metal wiring layer electrically connected to the plurality of pixels, wherein at least an area of the metal wiring layer comprises a plurality of holes, and a plane of each of the plurality of holes is shaped in a curve.

The plurality of holes may be arranged in a plurality of rows, and a hole in an n-th row may be spaced apart from a hole in a (n−1)th row by a first distance in a row direction.

The first distance may be smaller than a width of the hole in the (n−1)th row.

The first substrate may include a deformed area that is bent or folded, and the plurality of holes may be arranged in the metal wiring layer at a position corresponding to the deformed area.

Planes of the plurality of holes may have a same shape.

An outline of each of the plurality of holes may include a first curved portion and a second curved portion connected to the first curved portion.

Each of the first curved portion and the second curved portion may include a clockwise rounded section and a counterclockwise rounded section, with respect to a start point at a reference point on a first axis along a column direction.

The first curved portion may include a first section clockwise rounded with a first curvature from the first axis along the column direction, a second section connected to the first section and counterclockwise rounded with a second curvature from the first section, and a third section clockwise connection to the second section and clockwise rounded with a third curvature from the second section.

The second curved portion may be symmetrical to the first curved portion with respect to the first axis along the column direction perpendicular to the row direction.

The first curvature may be the same as the third curvature.

Another aspect is a flexible substrate for a display device, comprising: a first substrate that is flexible; and a metal wiring layer over the first substrate and having a first surface facing the first substrate, a second surface opposite to the first surface, and a plurality of holes penetrating the first and second surfaces, wherein the holes are arranged in a plurality of rows, wherein the holes comprise a first hole in an n-th row and a first hole in a (n−1)th row, wherein the first hole of the n-th row is spaced apart from the first hole in the (n−1)th row by a first distance, and wherein an edge of each of the holes is curved.

In the above flexible substrate, the first distance is less than a width of the second hole.

In the above flexible substrate, the first substrate comprises an area that is bent or folded, wherein the holes are arranged in the metal wiring layer at a position directly over the area.

In the above flexible substrate, the holes have the same shape.

In the above flexible substrate, each of the holes has a first curved portion and a second curved portion connected to the first curved portion.

In the above flexible substrate, each of the first and second curved portions comprises a plurality of round sections.

In the above flexible substrate, the first curved portion comprises: a first section that has a concave shape; a second section connected to the first section and having a convex shape; and a third section connected to the second section and having a concave shape.

In the above flexible substrate, the first and third sections are curved toward each other.

In the above flexible substrate, the first and second curved portions are symmetrical to each other with respect to the first axis extending in the first direction.

In the above flexible substrate, the first and third sections are symmetrical to each other with respect to a second axis extending in a second direction that is perpendicular to the first direction.

In the above flexible substrate, the first and second curved portions are symmetrical with respect to a second axis extending in a second direction crossing the first direction.

The above flexible substrate further comprises an insulating layer provided over the metal wiring layer.

In the above flexible substrate, each hole has a circular cross-section.

In the above flexible substrate, each hole has four concave portions that are connected at four corners.

Another aspect is a flexible display device comprising: a first substrate that is flexible; a plurality of pixels arranged over the first substrate, and a metal wiring layer electrically connected to the pixels, wherein at least an area of the metal wiring layer has a plurality of holes, and wherein an edge of each of the holes is curved.

In the above flexible display device, the holes are arranged in a plurality of rows, wherein the holes comprise a first hole in an n-th row and a first hole in a (n−1)th row, and the first hole of the n-th row is spaced apart from the first hole of the (n−1)th row by a first distance.

In the above flexible display device, the first distance is less than a width of the second hole.

In the above flexible display device, the first substrate comprises an area that is bent or folded, wherein the holes are arranged in the metal wiring layer at a position directly over the area.

In the above flexible display device, the holes have the same shape.

In the above flexible display device, each of the holes has a first curved portion and a second curved portion connected to the first curved portion.

In the above flexible display device, each of the first and second curved portions comprises a plurality of round sections.

In the above flexible display device, the first curved portion comprises: a first section that has a concave shape; a second section connected to the first section and having a convex shape; and a third section connected to the second section and having a concave shape.

In the above flexible display device, the first and second curved portions are symmetrical to each other with respect to the first axis extending in the first direction.

In the above flexible display device, the first and third sections are symmetrical to each other with respect to a second axis extending in a second direction that is perpendicular to the first direction.

Another aspect is a flexible display device comprising: a flexible substrate; and a metal layer over the flexible substrate, wherein the metal layer has a plurality of holes arranged in a plurality of rows, wherein each row of holes are arranged in a first direction, wherein centers of the odd row holes are aligned in a second direction crossing the first direction, and wherein centers of the even rows are not aligned with the centers of the odd row holes in the second direction.

In the above flexible display device, the centers of even row holes are aligned in the second direction.

DETAILED DESCRIPTION OF CERTAIN INVENTIVE EMBODIMENTS

Figure 1:
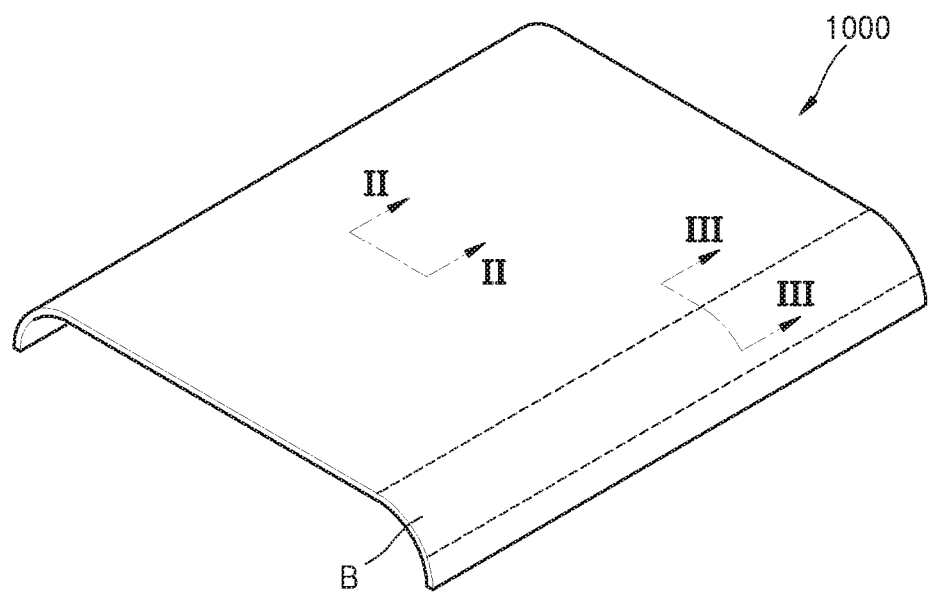
FIG. 1 is a perspective view schematically illustrating a flexible display device of according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the described technology allows for various changes and numerous embodiments, embodiments will be illustrated in the drawings and described in detail in the written description. However, this is not intended to limit the described technology to particular modes of practice, and it is to be appreciated that all changes, equivalents, and substitutes that do not depart from the spirit and technical scope of the described technology are encompassed in the described technology. In the description of the described technology, certain detailed explanations of the related art are omitted when it is deemed that they may unnecessarily obscure the essence of the described technology.

While such terms as "first," "second," etc., may be used to describe various components, such components must not be limited to the above terms. The above terms are used only to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

FIG. 1 is a perspective view schematically illustrating a flexible display device 1000 according to an embodiment.

The flexible display device 1000 includes a deformed area B that is bent or folded. In some embodiments, a partial area is temporarily or permanently deformed.

The flexible display device 1000 may include the deformed area B at opposite edge portions as illustrated in FIG. 1.

However, the position or number of the deformed area B included in the flexible display device 1000 is not limited to the above description, and the deformed area B may be located at any position only if the deformed area B is included in the flexible display device 1000.

In some embodiments, the deformed area B is a display area where an image is displayed so that a user may recognized the image. In another embodiment, the deformed area B is a bezel area that shields light.

In some embodiments, a portion where the deformed area B is formed is not limited, and the display area may be bent or folded or the bezel area may be bent or folded.

Figure 2:
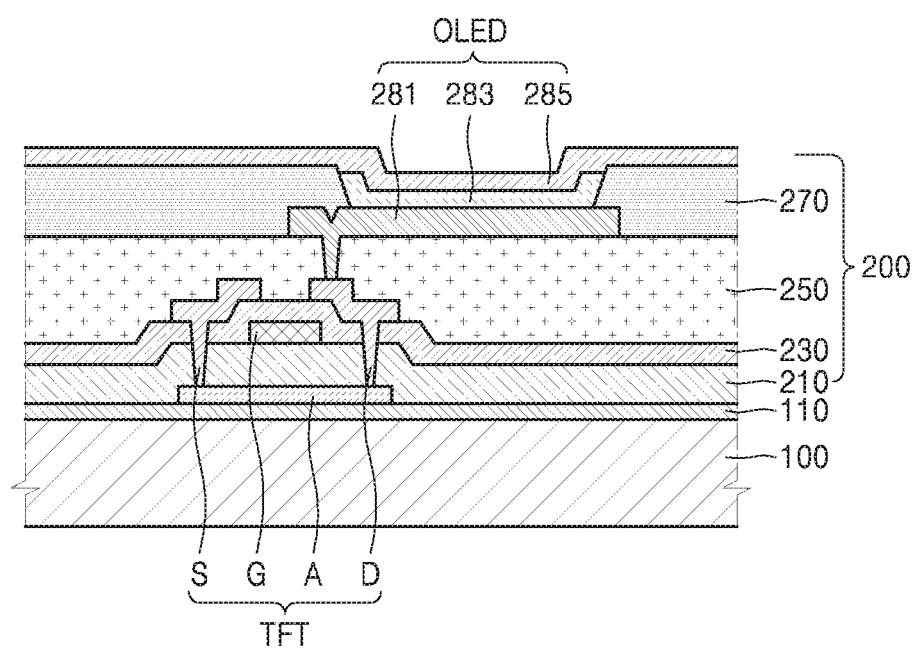
FIG. 2 is a cross-sectional view taken along a line II-II of FIG. 1, schematically illustrating a first substrate and a display portion including a light-emitting device.

FIG. 2 is a cross-sectional view taken along a line II-II of FIG. 1, schematically illustrating a first substrate 100 and a display portion 200 including an organic light-emitting diode (OLED).

The display portion 200 may be formed on the first substrate 100 and may include an array of a plurality of pixels formed on the first substrate 100.

The pixels may be electrically connected to one another by a metal wiring layer.

The metal wiring layer may include all wirings provided on the first substrate 100 such as a wiring including a gate electrode G, a wiring including a source electrode S and drain electrode D, or a wiring including a first electrode 281 or a second electrode 283.

Furthermore, each of the pixels may include a thin film transistor (TFT) and a light-emitting device controlled by the TFT. The light-emitting device may be an OLED that emits light by itself.

Although the display portion 200 of the present embodiment is not limited to one including an OLED, in the following description, for convenience of explanation, the display portion 200 is configured by the OLED.

According to the present embodiment, the flexible display device 1000 (see FIG. 1) has characteristics of an improved flexibility including the deformed area B (see FIG. 1). Accordingly, the first substrate 100 including a deformed area (not shown) may be formed of a material exhibiting superior elongation.

In some embodiments, the first substrate 100 includes a deformed area (not shown) having characteristics of flexibility to be capable of being bent or folded.

For example, the first substrate 100 is formed of a material having a Poisson's ratio of about 0.4 or more. The Poisson's ratio indicates a ratio of reduction in a length of a material in one direction when the length increases by pulling the material in the other direction. The Poisson's ratio of about 0.4 or more of the material forming the first substrate 100 signifies that the first substrate 100 is characteristically well elongated. As the first substrate 100 is formed of a material exhibiting superior elongation, flexibility of a display apparatus in the deformed area B is improved so that bending may be easily made.

In the present embodiment, the first substrate 100 includes is formed of at least one of silicone-based polymer, polyurethane, polyurethane acrylate, acrylate polymer, and acrylate terpolymer. The silicone-based polymer may include, for example, polydimethylsiloxane (PDMS), or hexamethyldisiloxane (HMDSO). Accordingly, the first substrate 100 may characteristically have flexibility and be elongated in two dimensions.

A buffer layer 110 may be formed on the first substrate 100. The buffer layer 110 may prevent diffusion of impurity ions into the display portion 200, prevent intrusion of moisture or external air, and function as a barrier layer and/or blocking layer for planarizing a surface of the first substrate 100.

The TFT may be formed above the buffer layer 110. In the following description, the TFT is described to be a top gate type in which a semiconductor layer A, the gate electrode G, the source electrode S and the drain electrode D are sequentially formed. However, the present disclosure is not limited thereto and a TFT of a variety of types including a bottom gate type may be employed.

The semiconductor layer A may be formed of polysilicon and may include a channel region in which impurities are not doped. The semiconductor layer A may also include a source region and a drain region which are formed at opposite sides with respect to the channel region and are doped with impurities. The impurities may differ according to the type of a thin film transistor, and N-type impurities and P-type impurities are available.

After the semiconductor layer A is formed, a gate insulating film 210 may be formed on the semiconductor layer A and over an entire surface of the first substrate 100. The gate insulating film 210 may be a multilayer or a single layer of a film formed of an inorganic material such as silicon oxide or silicon nitride. The gate insulating film 210 insulates the semiconductor layer A and the gate electrode G disposed above the semiconductor layer A.

After the gate insulating film 210 is formed, the gate electrode G may be formed on the gate insulating film 210. The gate electrode G may be formed through a photolithography process and an etching process.

A material of the gate electrode G may include one of more metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), titanium (Ti), tungsten (W), and copper (Cu).

After the gate electrode G is formed, an interlayer insulating film 230 may be over an entire surface of the first substrate 100.

The interlayer insulating film 230 may be formed of an inorganic material. For example, the interlayer insulating film 230 is formed of a metal oxide or a metal nitride. For example, the inorganic material is formed of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZrO_2$).

The interlayer insulating film 230 may be a multilayer or a single layer of a film formed of an inorganic material such as silicon oxide ($SiO_2$) and/or silicon nitride ($SiN_x$). In some embodiments, the interlayer insulating film 230 may be a dual structure of $SiO_x/SiN_y$ or $SiN_x/SiO_y$.

The source electrode S and the drain electrode D of the TFT may be arranged on the interlayer insulating film 230. The source electrode S and the drain electrode D may be formed of one or more metals selected from aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu).

As illustrated in FIG. 2, a via layer 250 may be formed over the entire surface of the first substrate 100, covering the source electrode S and the drain electrode D. The first electrode 281 may be formed on the via layer 250. According to the embodiment of FIG. 2, the first electrode 281 is connected to the drain electrode D through a via hole.

The via layer 250 may be formed of an insulating material. For example, the via layer 250 may be formed of an inorganic material, an organic material, or an organic/inorganic composite material in a single layer or a multilayer by a variety of deposition methods. In some embodiments, a planarized layer PL may be formed of at least one material of polyacrylate resin, epoxy resin, phenolic resin, polyamides resin, polyimide rein, unsaturated polyesters resin, polyphenylene ether resin, polyphenylene sulfide resin, and benzocyclobutene (BCB).

The OLED may be provided above the via layer 250. The OLED may include the first electrode 281, an intermediate layer 283 including an organic light-emitting layer, and a second electrode 285. Holes and electrons injected by the first electrode 281 and the second electrode 285 of the OLED are combined with each other in the organic light-emitting layer of the intermediate layer 283, thereby generating light.

The first electrode 281 and/or the second electrode 285 may be provided as a transparent electrode or a reflective electrode. When the first electrode 281 and/or the second electrode 285 are provided as transparent electrodes, the first electrode 281 and/or the second electrode 285 may include ITO, IZO, ZnO, or $In_2O_3$. When the first electrode 281 and/or the second electrode 285 are provided as reflective electrodes, the first electrode 281 and/or the second electrode 285 may include a reflective film formed of Ag, Mg, Al, Pt, Pd, Au, Ni, Nd, Ir, Cr, or a compound thereof, and a transparent film formed of ITO, IZO, ZnO, or $In_2O_3$. In some embodiments, the first electrode 281 or the second electrode 285 may have an ITO/Ag/ITO structure.

The intermediate layer 283 may include an organic light-emitting layer. In some embodiments, the intermediate layer 283 may include an organic light-emitting layer (emission layer) and may further include at least one of a hole injection layer (HIL), a hole transport layer (HTL), an electron transport layer (ETL), and an electron injection layer (EIL). The present disclosure is not limited thereto, and the intermediate layer 283 may further include an organic light-emitting layer and other various functional layers.

The second electrode 285 is formed on the intermediate layer 283. The second electrode 285 forms an electric field with the first electrode 281 so that light may be emitted from the intermediate layer 283. The first electrode 281 may be patterned for each pixel, and the second electrode 285 may be formed such that a common voltage may be applied thereto across all pixels.

The first electrode 281 is formed above the via layer 250 and may be electrically connected to any one of the source electrode S and the drain electrode D.

In some embodiments, the first electrode 281 is patterned, for example, for each pixel. The display portion 200 may further include a pixel define film 270. The pixel define film 270 may include an opening (not shown) for exposing the first electrode 281. The intermediate layer 283 is formed corresponding to the opening and may be electrically connected to the first electrode 281.

Figure 3:
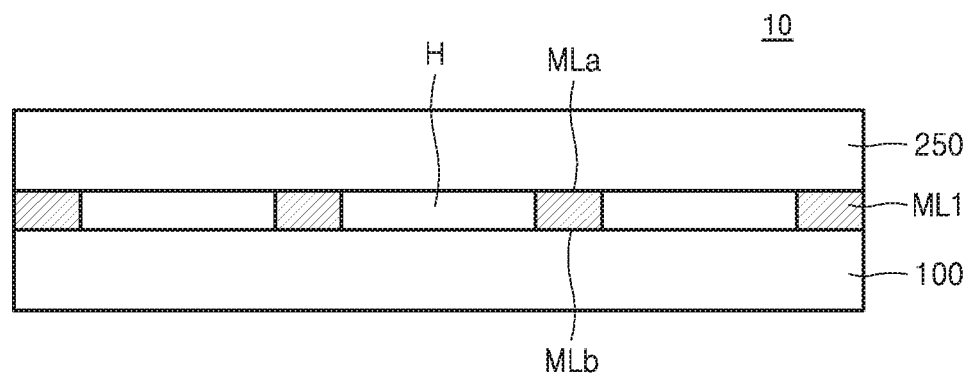
FIG. 3 is a cross-sectional view taken along a line III-III of FIG. 1, schematically illustrating a section of a flexible substrate.

FIG. 3 is a cross-sectional view taken along a line III-III of FIG. 1, schematically illustrating a section of a flexible substrate 10.

The flexible substrate 10 according to the present embodiment may include the first substrate 100 that is flexible and a metal wiring layer ML1 provided on the first substrate 100.

As described above, the first substrate 100 may have the characteristics of flexibility to be capable of being bent or folded. The metal wiring layer ML1 may be formed on the first substrate 100 that is flexible.

As described above, the first substrate 100 that is flexible may include a deformed area that is bent or folded. FIG. 3 illustrates a portion corresponding to the deformed area, which is described below.

The metal wiring layer ML1 may electrically connect the pixels. In some embodiments, the metal wiring layer ML1 is a wiring through which an electric signal is transferred to display an image on a display apparatus so that a user may recognize the image.

Although FIG. 3 illustrates only one metal wiring layer ML1, the present disclosure is not limited thereto and two or more metal wiring layers may be formed in a multilayer on the first substrate 100.

The metal wiring layer ML1 may be a power voltage line forming the gate electrode G or a data wiring forming the source electrode S and the drain electrode D. Furthermore, the metal wiring layer ML1 may be a wiring forming the first electrode 281 or the second electrode 285.

In some embodiments, the metal wiring layer ML1 includes any wiring capable of electrically connecting the pixels formed on the first substrate 100.

In some embodiments, a material of the metal wiring layer ML1 includes at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), titanium (Ti), tungsten (W), and copper (Cu).

The metal wiring layer ML1 may include a first surface MLb facing the first substrate 100 and a second surface MLa located at the opposite side to the first surface MLb.

In some embodiments, the metal wiring layer ML1 may include a plurality of holes H penetrating from the first surface MLb to the second surface MLa.

The number and positions of the holes H are not limited. When the metal wiring layer ML1 is formed in a multilayer, the holes H may be formed in a single metal wiring layer ML1 or two or more metal wiring layers ML1.

According to the present embodiment, the flexible substrate 10 further includes an insulating layer provided on the metal wiring layer ML1.

In some embodiments, the metal wiring layer ML1 of FIG. 3 may be a data wiring for forming the source electrode S and the drain electrode D.

In this case, as described above with reference to FIG. 2, the via layer 250 is formed on the entire surface of the first substrate 100, covering the source electrode S and the drain electrode D. As illustrated in FIG. 3, the insulating layer provided on the metal wiring layer ML1 may be the via layer 250.

Although FIG. 3 illustrates the embodiment in which the via layer 250 is formed on the metal wiring layer ML1, the present disclosure is not limited thereto and any insulating layer including the interlayer insulating film 230, the via layer 250, and the pixel define film 270 may be formed along the metal wiring layer ML1 where the holes H are formed.

Figure 4:
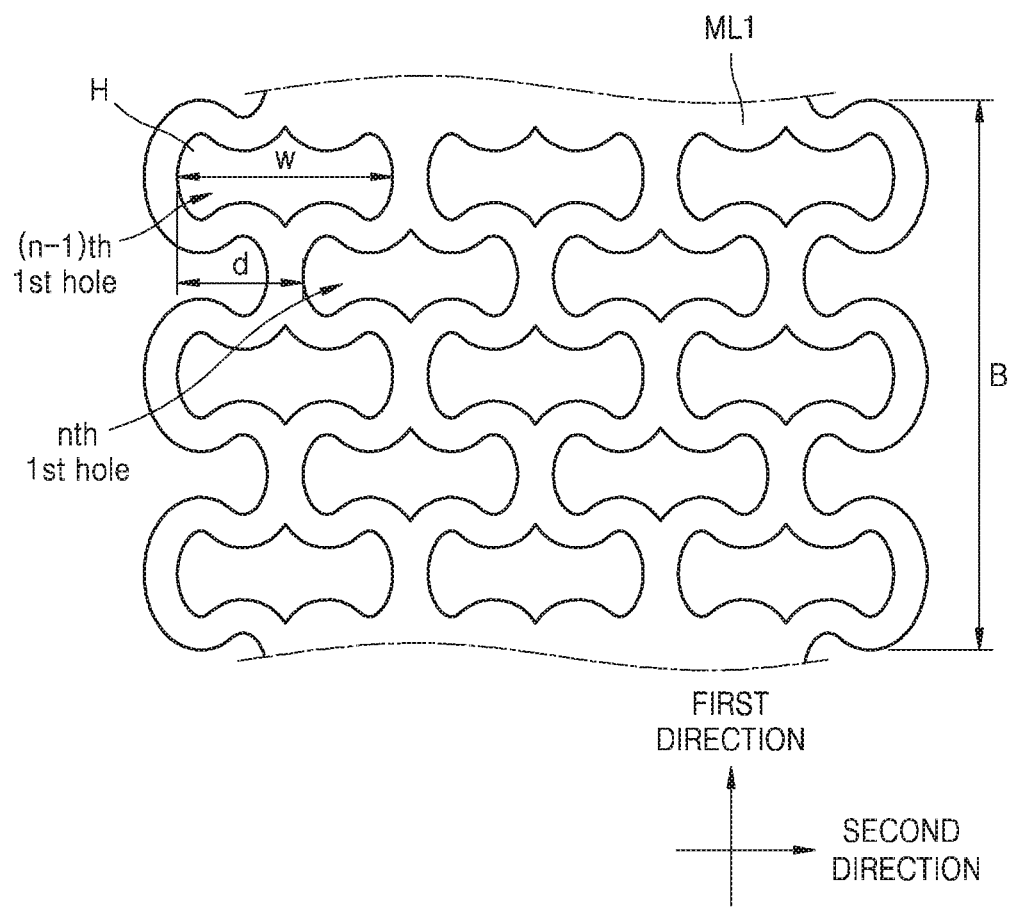
FIG. 4 is a plan view schematically illustrating a part of a plane of a metal wiring layer of FIG. 3.

FIG. 4 is a plan view schematically illustrating a part of a plane of the metal wiring layer ML1 of FIG. 3.

As described above, according to the present embodiment, the metal wiring layer ML1 may include a plurality of holes H.

The holes H may be arranged forming a plurality of rows.

However, the number of the holes H or the number of the rows is not limited and two or more holes H may be arranged in two or more rows.

In some embodiments, as illustrated in FIG. 4, the plane of the holes H has the same shape.

The shape of a plane of the holes H formed in the metal wiring layer ML1 is not limited to the embodiment of FIG. 4. A detailed description on the shape of the plane of the holes H is presented later.

At least a part of the metal wiring layer ML1 according to the present embodiment may be located in the deformed area B.

FIG. 4 is a plan view schematically illustrating the metal wiring layer ML1 located in the deformed area B by enlarging the same.

In this case, a portion of the metal wiring layer ML1 corresponding to the deformed area B may be temporarily or permanently bent or folded.

The metal wiring layer ML1 may be formed of a metal material as described above. The metal has a low flexibility so that stress applied to the metal wiring layer ML1 may concentrate in the deformed area B.

When stress concentrates on the metal wiring layer ML1, the metal wiring layer ML1 may be short-circuited or a crack may be generated in the metal wiring layer ML1. In this case, the metal wiring layer ML1 does not properly perform its role of transmitting an electric signal to the pixels so that reliability of the flexible display device 1000 may be degraded.

Accordingly, since the holes H are formed in the metal wiring layer ML1 according to the present embodiment at positions corresponding to the deformed area B, flexibility of the metal wiring layer ML1 may be improved.

In some embodiments, the hole H in the n-th row may be spaced apart from the hole H in the (n−1)th row by a first distance "d" in a row (or first) direction.

In some embodiments, for the holes H in consecutive rows, the center axes of the holes H in a column direction are located not at the same position, but at positions to be deviated from each other.

In some embodiments, the hole H in the n-th row may be shifted by the first distance "d" to the left or right from the hole H in the (n−1)th row.

In some embodiments, the first distance "d" may be smaller than a width "w" of the hole H in the (n−1)th row.

For example, when the hole H in the n-th row is moved to the (n−1)th row in the column direction, an area where the hole H in the n-th row overlaps the hole H in the (n−1)th row after the movement in the column direction may be generated.

In the embodiment of FIG. 4, the center axes of the holes H located in the first row, the third row, and the fifth row are located at the same position in the column direction, whereas the center axes of the holes H located in the second row and the fourth row are located at the same position in the column direction.

However, the arrangement of the holes H according to the described technology is not limited thereto.

In the following description, the shape of a plane of each of the holes H is described in detail.

Figure 5A:
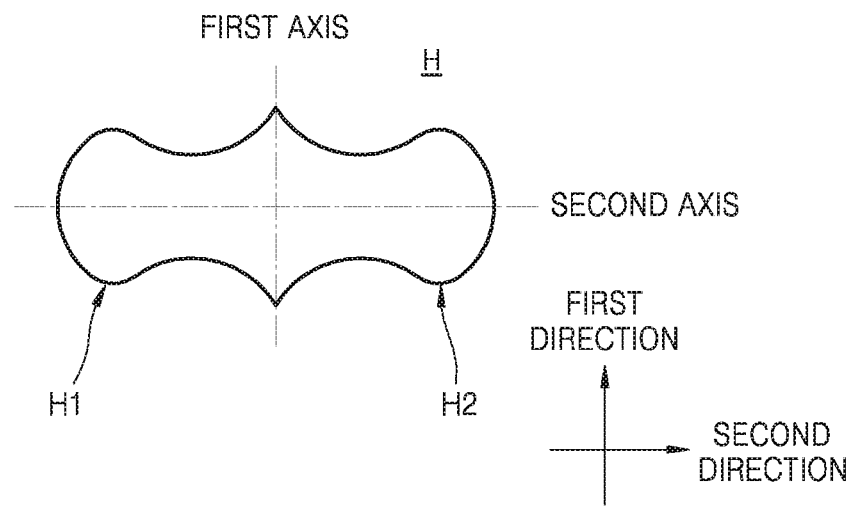
FIGS. 5A and 5B are enlarged views schematically illustrating one of a plurality of holes H illustrated in FIG. 4.
Figure 5B:
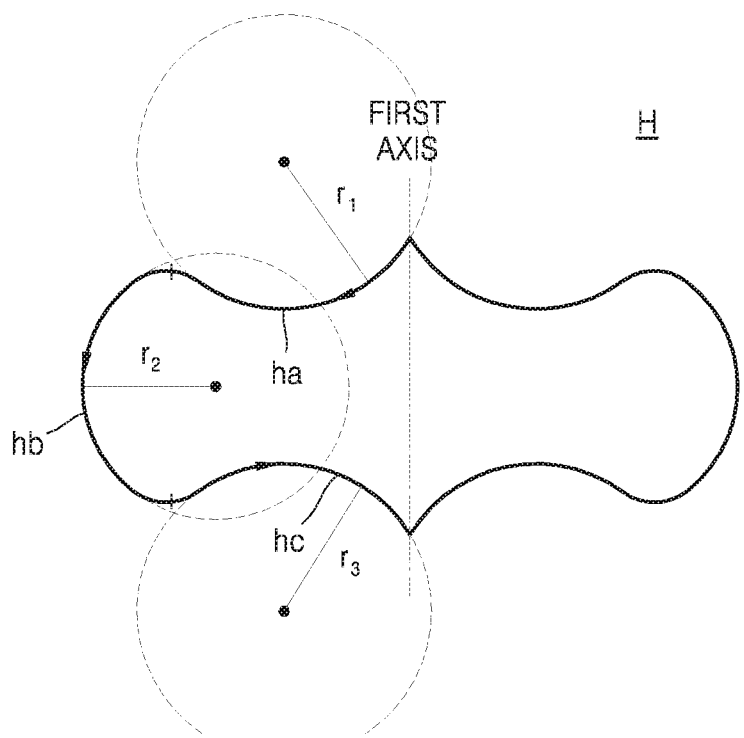

FIGS. 5A and 5B are enlarged views schematically illustrating one of the holes H illustrated in FIG. 4.

According to the present embodiment, a plane of each of the holes H may be outlined with a curve.

A straight line signifies the shortest line connecting between two points, and a curve signifies a line when a point continuously moves on a plane or in a space.

In some embodiments, the outline of the holes H may not include straight lines, but may include curves only.

When the metal wiring layer ML1 is bent or folded in the deformed area B, the stress applied to the metal wiring layer ML1 is distributed and thus the possibility of the metal wiring layer ML1 being damaged by the generation of a short-circuit or a crack may be reduced.

In the flexible display device 1000 according to the present embodiment, in the case where the outline of the holes H is shaped in curves only, the stress may be efficiently distributed, compared to a case in which the outline of the holes H includes straight lines.

For example, when the metal wiring layer ML1 (see FIG. 4) is bent or folded, the stress applied to the metal wiring layer ML1 is greater at a portion where the outline of the holes H is a straight line than at a portion where the outline of the holes H is a curve. Thus, when the outline of the holes H is shaped in curves only, the concentration of the stress during deformation of the metal wiring layer ML1 may be efficiently prevented.

In some embodiments, when the holes H are formed in the metal wiring layer ML1, the outline of the metal wiring layer ML1 corresponding to an area where the holes H are formed may also be shaped in curves along the shape of the holes H.

For example, the metal wiring layer ML1 included in the flexible display device 1000 may be bent or folded in some area corresponding to the deformed area B, and the holes H may be arranged at positions corresponding to the deformed area B. In the deformed area B where the holes H are formed, the outline of the metal wiring layer ML1 may also be shaped in curves along the shape of the holes H.

In some embodiments, as illustrated in FIG. 4, in the deformed area B where the holes H are formed, both of the left and right outlines of the metal wiring layer ML1 may be shaped in curves along the shape of the holes H.

For example, when the outline of the metal wiring layer ML1 is formed along the shape of holes H, since not only the holes H is shaped in curves but also the outline of the metal wiring layer ML1 is shaped in curves like the shape of the holes H, the flexibility of the metal wiring layer ML1 may be efficiently improved.

However, the outline of the metal wiring layer ML1 may be shaped in straight lines even if it is a portion where the holes H are formed.

In some embodiments, the outline of each of the holes H includes a first curved portion H1 and a second curved portion H2.

Each of the holes H may include the first curved portion H1 that is an outline of the hole H formed at the left of a first axis along the column direction and the second curved portion H2 that is an outline of the hole H formed at the right of the first axis.

In some embodiments, the first curved portion H1 and the second curved portion H2 are connected to each other without an interruption.

The outline of the hole H may have a sharp point at a connection point formed on the first axis and where the first curved portion H1 and the second curved portion H2 are connected to each other. The sharp point is a point where two curves having opposite inclinations of tangent lines are connected to each other, and does not form a straight line.

For example, according to the present embodiment, the outline of holes H may be shaped in curves including the first curved portion H1 and the second curved portion H2 connected to the first curved portion H1.

In some embodiments, each of the first curved portion H1 and the second curved portion H2 may include a clockwise rounded section and a counterclockwise rounded section, with respect to a certain start point.

For example, each of the first curved portion H1 and the second curved portion H2 may include a portion forming a curve in a clockwise direction from a certain point and a portion forming a curve in a counterclockwise from a certain point.

The first curved portion H1 and the second curved portion H2 are described in detail with reference to FIG. 5B.

As illustrated in FIG. 5B, the first curved portion H1 includes a first section ha, a second section hb, and a third section hc.

In some embodiments, the first section ha may be a clockwise rounded section having a start point at a point of the first curved portion H1 located on the first axis along the column direction.

In some embodiments, the first section ha may have a first curvature.

A curvature is a change rate value indicating a degree of bending of a curve. When a point p on a curve moves along the curve at a constant speed, a proceeding direction thereof is changed according to a movement distance. In this state, a change rate is referred to a curvature of a curve.

A radius of curvature r and a curvature are in a reciprocal relation. For example, the value of a curvature may be indicated to be a reciprocal $1/r$ of the radius of curvature r.

Accordingly, as illustrated in FIG. 5B, the first section ha may have a first curvature, and the first curvature may be $1/r^1$ that is a reciprocal of a radius of curvature $r^1$.

The first curved portion H1 may include the second section hb connected to the first section ha.

In some embodiments, the second section hb may be a counterclockwise rounded section having a start point at a point connected to the first section ha.

In some embodiments, the second section hb may have a second curvature.

The second curvature may be $1/r^2$ that is a reciprocal of the radius of curvature $r^2$.

The first curved portion H1 may include the third section hc connected to the second section hb.

In some embodiments, the third section hc may be a clockwise rounded section having a start point at a point connected to the second section hb.

The third section hc may have a third curvature, and the third curvature may be $1/r^3$ that is a reciprocal of the radius of curvature $r^3$.

The values of the first curvature $1/r^1$, the second curvature $1/r^2$, and the third curvature $1/r^3$ are not limited to the above, and the respective values may be different from one another, two curvatures may be the same, or all curvature values are the same.

When the outline of the plane of the holes H is shaped in curves only, the shape of the outline of the plane of the holes H is not limited to the shape of FIGS. 5A and 5B and thus the holes H may be formed in any shape.

As illustrated in FIG. 5A, the second curved portion H2 may be symmetrically formed with the first curved portion H1 with respect to the first axis along the column direction.

For example, the second curved portion H2 may be formed in the same shape as the first curved portion H1, and the outline of the holes H may be left-right symmetrical with respect to the first axis.

In some embodiments, the first curvature $1/r^1$ may be the same as the third curvature $1/r^3$.

For example, the first curved portion H1 may be symmetrically formed with respect to a second axis in the row direction and passing through the first curved portion H1.

In some embodiments, when the first curved portion H1 and the second curved portion H2 are symmetrically formed with respect to the first axis along the column direction, the second curved portion H2 may also be symmetrically formed with respect to the second axis.

For example, the outline of the holes H may be left-right symmetrical with respect to the first axis passing through the middle of the holes H in the column direction, and may be up-down symmetrical with respect to the second axis passing through the middle of the holes H in the row direction.

Figure 6A:
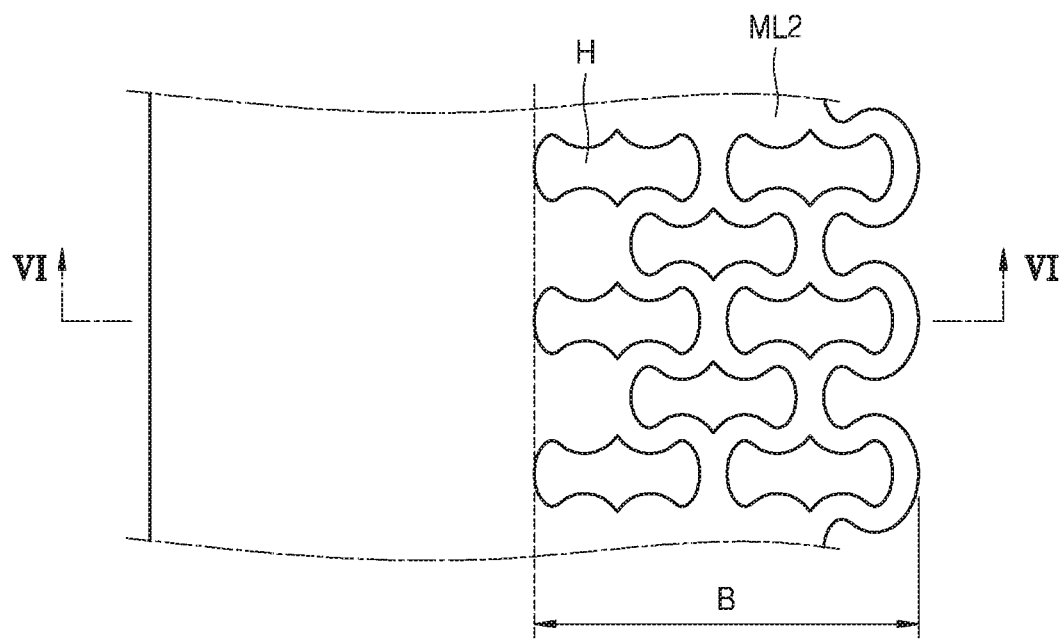
FIG. 6A is a plan view schematically illustrating a part of a plane of a metal wiring layer according to another embodiment.
Figure 6B:
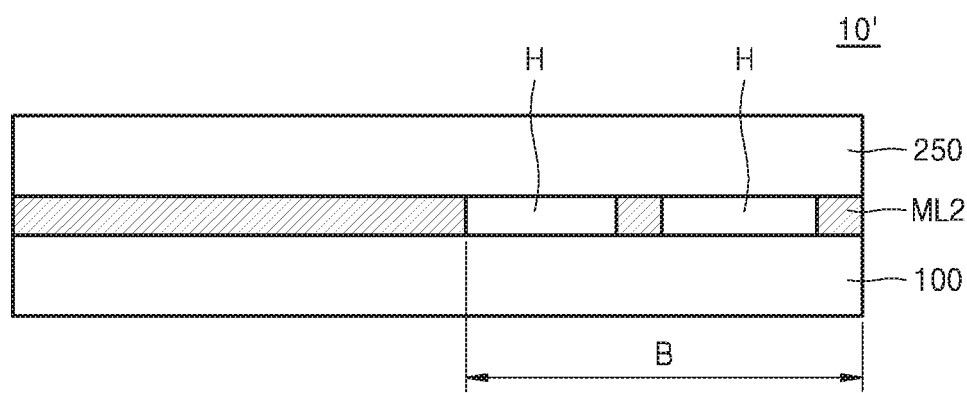
FIG. 6B is a cross-sectional view taken along a line VI-VI of FIG. 6A.

FIG. 6A is a plan view schematically illustrating a part of a plane of a metal wiring layer ML2 according to another embodiment. FIG. 6B is a cross-sectional view taken along a line VI-VI of FIG. 6A. In FIGS. 6A and 6B, like reference numerals in FIGS. 3 and 4 denote like elements, and redundant descriptions thereof are omitted for convenience of explanation.

The metal wiring layer ML2 according to the present embodiment may also be a power voltage line forming the gate electrode G or a data wiring forming the source electrode S and the drain electrode D. Furthermore, the metal wiring layer ML2 may be a wiring forming the first electrode 281 or the second electrode 285 included in the OLED.

For example, the metal wiring layer ML2 includes any wiring capable of electrically connecting the pixels and provided on the first substrate 100.

In some embodiments, a material of the metal wiring layer ML2 may be formed of at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), titanium (Ti), tungsten (W), and copper (Cu).

The metal wiring layer ML2 may include the holes H.

In some embodiments, the holes H may form a plurality of rows.

However, the number of the holes H or the number of rows is not limited and thus two or more holes H may be arranged in two or more rows.

In some embodiments, as illustrated in FIG. 6A, the plane of the holes H may have the same shape.

A flexible substrate 10' may include the deformed area B that is partially bent or folded.

For example, as illustrated in FIG. 6B, only a partial area of the flexible substrate 10' in a widthwise direction may correspond to the deformed area B.

Accordingly, the metal wiring layer ML2 at a position corresponding to the deformed area B may be bent or folded.

In some embodiments, as illustrated in FIG. 6A, only a part of the metal wiring layer ML2 in a widthwise direction may be located in the deformed area B that is bent or folded.

In some embodiments, the holes H may be arranged only in the metal wiring layer ML2 at the position corresponding to the deformed area B.

In the deformed area B, stress concentrates on the metal wiring layer ML2 formed of metal and having a low flexibility and thus the metal wiring layer ML2 may be damaged by the generation of a short-circuit or a crack in the part where stress concentrates.

Accordingly, the formation of the holes H in the deformed area B may distribute the stress and thus the flexibility of the metal wiring layer ML2 may be improved.

In some embodiments, the hole H in the n-th row may be spaced apart from the hole H in the (n−1)th row by a first distance "d" in a row direction.

For example, for the holes H in consecutive rows, the center axes of the holes H in a column direction are located not at the same position, but at positions to be deviated from each other.

In some embodiments, the hole H in the n-th row may be deviated by the first distance "d" to the left or right from the hole H in the (n−1)th row.

In some embodiments, the first distance "d" may be smaller than a width "w" of the hole H in the (n−1)th row.

For example, when the hole H in the n-th row is moved to the (n−1)th row in the column direction, an area where the hole H in the n-th row overlaps the hole H in the (n−1)th row after the movement in the column direction may be generated.

However, the arrangement of the holes H is not limited thereto.

The plane of the outline of the holes H may be shaped in a curve.

In some embodiments, the outline of the holes H may be shaped in a straight line and may be shaped in a curve only.

When the outline of the holes H does not include a straight line and is shaped in curves only, the concentration of stress may be reduced and the generation of a short-circuit or a crack in the wiring may be efficiently prevented.

Since FIGS. 6A and 6B illustrate the holes H having the same shape as the holes H illustrated in FIGS. 4 and 5, for convenience of explanation, a description of the shape of the plane of the holes H is omitted.

However, as described above, the shape of the holes H is not limited to the above-described embodiments of FIGS. 4 to 6, and any shape in curves may be employed.

In some embodiments, when the holes H are formed in the deformed area B, the outline of the metal wiring layer ML2 at a part where the holes H are formed may also be shaped in curves along the shape of the holes H.

In this case, the flexibility of the metal wiring layer ML2 is efficiently improved so that the metal wiring layer ML2 may be smoothly deformed without the concentration of stress.

In some embodiments, as illustrated in FIG. 6A, only a partial middle area of the metal wiring layer ML2 in a widthwise direction may include the deformed area B, and the holes H may be arranged in the deformed area B. Furthermore, the outline of the metal wiring layer ML2 located in the deformed area B may be shaped in curves along the shape of the holes H.

However, the outline of the metal wiring layer ML2 may be shaped in straight lines even if it is a portion where the holes H are formed.

Figure 7:
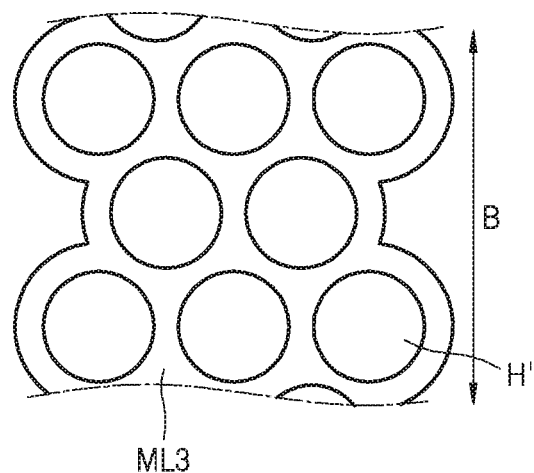
FIG. 7 is a plan view schematically illustrating a part of a plane of a metal wiring layer according to another embodiment.

FIG. 7 is a plan view schematically illustrating a part of a plane of a metal wiring layer ML3 according to another embodiment.

The metal wiring layer ML3 according to the present embodiment may also be a power voltage line forming the gate electrode G or a data wiring forming the source electrode S and the drain electrode D. Furthermore, the metal wiring layer ML3 may be a wiring forming the first electrode 281 or the second electrode 285.

For example, the metal wiring layer ML3 may include any wiring capable of electrically connecting the pixels.

In some embodiments, a material of the metal wiring layer ML3 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), titanium (Ti), tungsten (W), and copper (Cu).

FIG. 7 is a plan view schematically illustrating the metal wiring layer ML3 according to another embodiment at a position corresponding to the deformed area B by enlarging the same. In this case, a portion of the metal wiring layer ML3 corresponding to the deformed area B may also be temporarily or permanently bent or folded.

The metal wiring layer ML3 may include a plurality of holes H'.

The holes H' may be arranged forming a plurality of rows.

However, the number of the holes H' or the number of the rows is not limited thereto and two or more holes H' may be arranged forming two or more rows.

As the holes H' are arranged, stress applied to the metal wiring layer ML3 formed of a metal material during deformation may be distributed and the concentration of stress on the metal wiring layer ML3 may be reduced.

In some embodiments, as illustrated in FIG. 7, the shapes of the planes of the holes H' may be all identical.

In some embodiments, the outline of the plane of each of the holes H' may be shaped in a curve, for example, in the form of a circle as illustrated in FIG. 7.

The outline of the holes H' is not limited thereto. However, as the outline is shaped in curves only, stress may be efficiently distributed compared to a case of a straight line and thus the concentration of stress applied to the metal wiring layer ML3 may be reduced.

In some embodiments, in an area where the holes H', the outline of the metal wiring layer ML3 may be shaped in curves along the shape of the holes H'.

Accordingly, in the deformed area B, the stress concentrating on the metal wiring layer ML3 may be efficiently distributed.

However, the outline of the metal wiring layer ML3 may be shaped in straight lines or curves and is not limited when the deformed area B includes the holes H'.

Figure 8:
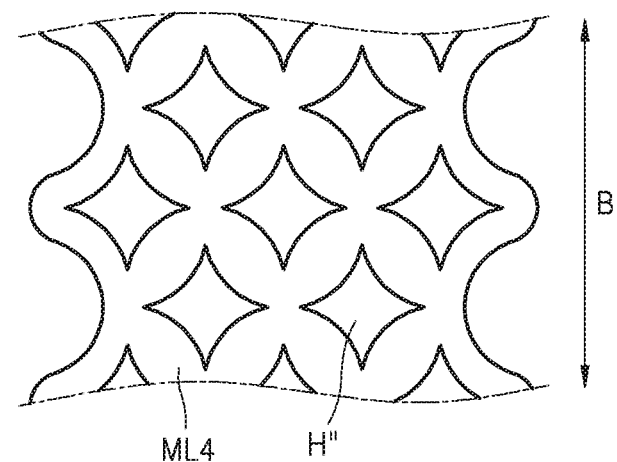
FIG. 8 is a plan view schematically illustrating a part of a plane of a metal wiring layer according to another embodiment.

FIG. 8 is a plan view schematically illustrating a part of a plane of a metal wiring layer ML4 according to another embodiment.

Since the function or material of the metal wiring layer ML4 of FIG. 8 is the same as that of the metal wiring layer ML3 of FIG. 7, a redundant description thereof is omitted for convenience of explanation.

The metal wiring layer ML4 at a position corresponding to the deformed area B may be partially bent or folded. A plurality of holes H" may be arranged in the metal wiring layer ML4 at the position corresponding to the deformed area B.

In some embodiments, the shapes of planes of the holes H" may be all identical.

In some embodiments, the outline of the plane of each of the holes H" may be shaped in a curve, and each of the holes H" may be vertically and horizontally symmetrical with respect to two center axes perpendicular to each other.

In some embodiments, the outline of the plane of each of the holes H" may include a clockwise rounded section and a counterclockwise rounded section, with respect to a certain start point.

As illustrated in FIG. 8, the outline of the holes H" may be shaped in four curves like a diamond shape.

The shape of the outline of the holes H" is not limited thereto and any shape in curves may be employed.

According to the above-described embodiments, since holes are formed in a metal wiring layer at a position corresponding to a deformed area, stress may be distributed.

Furthermore, since the holes are formed in curves, concentration of stress may be efficiently prevented, compared to a case in which the holes are formed in straight lines.

It should be understood that embodiments described herein should be considered in a descriptive sense only and not for purposes of limitation. Descriptions of features or aspects within each embodiment should typically be considered as available for other similar features or aspects in other embodiments.

While the inventive technology has been described with reference to the figures, it will be understood by those of ordinary skill in the art that various changes in form and details may be made therein without departing from the spirit and scope as defined by the following claims.

What is claimed is:

1. A flexible substrate for a display device, comprising:
   a first substrate that is flexible; and
   a metal wiring layer over the first substrate and having a first surface, a second surface opposite to the first surface, and a plurality of holes penetrating the first and second surfaces,
   wherein the holes are arranged in a plurality of rows,
   wherein the holes comprise a first hole in an n-th row and a first hole in a (n−1)th row,
   wherein the first hole of the n-th row is spaced apart from the first hole in the (n−1)th row by a first distance,
   wherein an edge of each of the holes is curved,
   wherein the first substrate has a same thickness in a region where the plurality of holes are formed and in a region where the metal wiring layer is formed, wherein an entirety of each of the plurality of holes penetrates the metal wiring layer to a level at which the second surface of the metal wiring layer directly contacts an upper surface of the first substrate, wherein each of the holes has a first curved portion and a second curved portion,
   wherein the first curved portion includes a first concave portion protruding in a first direction,
   wherein the second curved portion includes a third concave portion protruding in the first direction, and
   wherein the first concave portion is connected to the third concave portion to form a point.

2. The flexible substrate of claim 1, wherein the first distance is less than a width of a second hole of the plurality of holes.

3. The flexible substrate of claim 1, wherein the first substrate comprises an area that is bent or folded, and wherein the holes are arranged in the metal wiring layer at a position directly over the area.

4. The flexible substrate of claim 1, wherein the holes have a same shape.

5. The flexible substrate of claim 1, wherein each of the first and second curved portions comprises a plurality of round sections.

6. The flexible substrate of claim 5, wherein the first curved portion further comprises:
   a second section connected to the first concave portion and having a convex shape; and
   a third section connected to the second section and having a concave shape.

7. The flexible substrate of claim 6, wherein the first concave portion and the third section are curved toward each other.

8. The flexible substrate of claim 6, wherein the first and second curved portions are symmetrical to each other with respect to a first axis extending in the first direction.

9. The flexible substrate of claim 8, wherein the first concave portion and the third section are symmetrical to each other with respect to a second axis extending in a second direction that is perpendicular to the first direction.

10. The flexible substrate of claim 6, wherein the first and second curved portions are symmetrical with respect to a second axis extending in a second direction crossing the first direction.

11. The flexible substrate of claim 1, further comprising an insulating layer provided over the metal wiring layer.

12. The flexible substrate of claim 1, wherein each hole has four concave portions that are connected at four corners.

13. The flexible substrate of claim 1, wherein the first curved portion further includes:
   a first convex portion connected to the first concave portion and protruding in a second direction crossing the first direction; and
   a second concave portion connected to the first convex portion and protruding toward the first concave portion.

* * * * *